United States Patent
Rajendran et al.

(10) Patent No.: US 8,558,210 B2
(45) Date of Patent: Oct. 15, 2013

(54) POLYSILICON EMITTER BJT ACCESS DEVICE FOR PCRAM

(75) Inventors: Bipin Rajendran, White Plains, NY (US); Tak H. Ning, Yorktown Heights, NY (US); Chung H. Lam, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/449,378

(22) Filed: Apr. 18, 2012

(65) Prior Publication Data

US 2012/0199806 A1      Aug. 9, 2012

Related U.S. Application Data

(62) Division of application No. 11/971,761, filed on Jan. 9, 2008, now Pat. No. 8,217,380.

(51) Int. Cl.
H01L 45/00      (2006.01)

(52) U.S. Cl.
USPC ............... 257/3; 257/1; 257/2; 257/4; 257/5; 257/E45.002

(58) Field of Classification Search
USPC ............................................. 257/1, 2, 3, 4, 5
See application file for complete search history.

(56) References Cited

U.S. PATENT DOCUMENTS

| | | | |
|---|---|---|---|
| 5,717,241 A | 2/1998 | Malhi et al. | 257/378 |
| 8,217,380 B2 * | 7/2012 | Rajendran et al. | 257/3 |
| 2005/0122771 A1 | 6/2005 | Chen | G11C 11/00 |
| 2007/0013033 A1 | 1/2007 | Hayasi | H01L 29/7304 |

FOREIGN PATENT DOCUMENTS

WO   WO2006079952 A1   8/2006   ............ H01L 45/00

* cited by examiner

*Primary Examiner* — Matthew W Such
*Assistant Examiner* — David Spalla
(74) *Attorney, Agent, or Firm* — Ido Tuchman; Vazken Alexanian

(57) ABSTRACT

A resistive non-volatile memory cell with a bipolar junction transistor (BJT) access device formed in conjunction with the entire memory cell. The memory cell includes a substrate acting as a collector, a semiconductor base layer acting as a base, and a semiconductor emitter layer acting as an emitter. Additionally, metal plugs and the phase change memory element are formed above the BJT access device while the emitter, metal plugs, and phase change memory element are contained within an insulating region. In one embodiment of the invention, a spacer layer is formed and the emitter layer is contained within the protective spacer layer. The spacer layer is contained within the insulating region.

13 Claims, 10 Drawing Sheets

POLYSILICON EMITTER BJT ACCESS DEVICE FOR PCRAM

CROSS-REFERENCE TO RELATED APPLICATIONS

This application is a divisional application claiming priority under 35 U.S.C. §120 to U.S. patent application Ser. No. 11/971,761 filed Jan. 9, 2008, the entire text of which is specifically incorporated by reference herein.

FIELD OF THE INVENTION

The present invention is directed toward computer memory, and more particularly to resistive non-volatile memory, such as a phase change memory device.

BACKGROUND OF THE INVENTION

There are two major groups in computer memory: non-volatile memory and volatile memory. Constant input of energy in order to retain information is not necessary in non-volatile memory but is required in the volatile memory. Examples of non-volatile memory devices are Read Only Memory (ROM), Flash Electrical Erasable Read Only Memory, Ferroelectric Random Access Memory, Magnetic Random Access Memory (MRAM), and Phase Change Memory (PCM). Examples of volatile memory devices include Dynamic Random Access Memory (DRAM) and Static Random Access Memory (SRAM). The present invention is directed to resistive non-volatile memories, such as phase change memory. In phase change memory, information is stored in materials that can be manipulated into different phases. Each of these phases exhibit different electrical properties which can be used for storing information. The amorphous and crystalline phases are typically two phases used for bit storage (1's and 0's) since they have detectable differences in electrical resistance. Specifically, the amorphous phase has a higher resistance than the crystalline phase.

Glass chalcogenides are a group of materials commonly utilized as phase change material. This group of materials contain a chalcogen (Periodic Table Group 16/VIA) and a more electropositive element. Selenium (Se) and tellurium (Te) are the two most common semiconductors in the group used to produce a glass chalcogenide when creating a phase change memory cell. An example of this would be Ge2Sb2Te5 (GST), SbTe, and In2Se3. However, some phase change materials do not utilize chalcogen, such as GeSb. Thus, a variety of materials can be used in a phase change material cell as long as they can retain separate amorphous and crystalline states.

One problem in PCM and CMOS integration is the drive current required to create a phase change in the phase change material. Small MOSFET devices necessary to provide high density of bits per unit area do not provide enough current to switch the resistive state of phase change materials. A closely packed diode array can provide enough drive current for a resistive phase change in a memory cell but a significant amount of current crosses over to adjacent memory cells ("cross-talk") in high-density storage devices. Another possibility is the use of a bipolar junction transistor (BJT). However, the integration of CMOS and BJT arrays has proven difficult. Thus, it is desirable to find a method and structure capable of providing the drive current necessary for resistive phase change in a memory cell, minimizing cross-talk between memory cells, and easily integrated into a CMOS circuit.

BRIEF SUMMARY OF THE INVENTION

One exemplary aspect of the present invention is a memory cell. The memory cell being comprised of, at least in part, a substrate, an insulating region, a base layer, an emitter layer, a plug, a phase change element, and a top electrode. The substrate can be, but is not limited to, bare silicon substrate or silicon substrate with a layer of insulating material deposited on the top surface of the silicon substrate. The insulating region includes insulating material formed above the substrate. The base layer includes a first semiconductor material above the substrate and contained within the insulating region. The emitter layer includes a second semiconductor material above the base layer and contained within the insulating region. Furthermore, the second semiconductor material is substantially polycrystalline silicon. The plug includes conductive material above the emitter layer and contained within the insulating region. The phase change element includes phase change material above the plug and contained within the insulating region. The top electrode layer includes conductive material above the phase change element and contained within the insulating region.

Another exemplary aspect of the present invention is a memory array comprising one or more memory cells, at least one of the memory cells comprising a substrate, an insulating region, a base layer, an emitter layer, a plug, a phase change element, and a top electrode. The substrate is comprised of silicon. The insulating region includes insulating material above the substrate. The base layer includes silicon above the substrate and contained within the insulating region, the base layer forming a word-line. The emitter layer includes a semiconductor material above the base layer and contained within the insulating region. Furthermore, the semiconductor material is substantially polycrystalline silicon. The plug includes conductive material above the emitter layer and contained within the insulating region. The phase change element includes phase change material above the plug and contained within the insulating region. The top electrode layer includes conductive material above the phase change element and contained within the insulating region, the top electrode forming a bit-line.

DETAILED DESCRIPTION OF THE INVENTION

Figure 1:
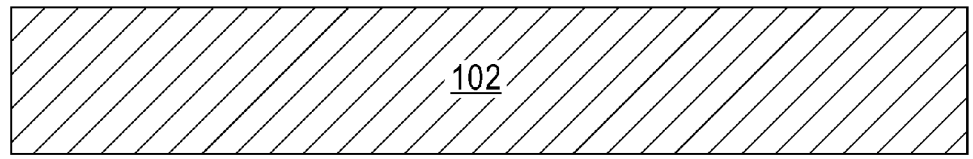
FIG. 1 illustrates a starting substrate.

The present invention is described with reference to embodiments of the invention. Throughout the description of the invention reference is made to FIGS. 1-17. When referring to the figures, like structures and elements shown throughout are indicated with like reference numerals.

As described in detail below, an aspect of the present invention is a phase change memory (PCM) cell structure with a PNP bipolar junction transistor (BJT) access device. The BJT access device provides the drive current to operate the PCM device with minimal crosstalk between adjacent individual memory cells. Furthermore, memory cells of the present invention may be advantageously formed together with CMOS devices, such as MOSFETs, on the same substrate. Thus, embodiments of the present invention can utilize both the low crosstalk advantages of the BJT memory cell design and the CMOS power consumption advantages of peripheral circuitry on the same integrated circuit.

FIG. 1 illustrates an exemplary embodiment of a P-doped silicon substrate 102. As discussed in detail below, the silicon substrate 102 acts as a collector in the PNP BJT access device. In an alternate embodiment, a blanket P+ implant is performed on the silicon substrate 102. It is noted that although a PNP BJT structure is described herein, those skilled in the art will understand the claimed invention may also be achieved using a NPN BJT structure with drive polarities and dopant species reversed. Thus, the substrate 102 may alternatively be doped with N material.

Figure 2:
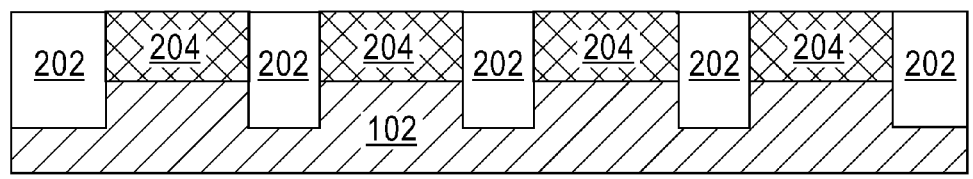
FIG. 2 illustrates shallow trench isolation processes and base layer deposition.

FIG. 2 illustrates a base layer 204 is formed on the substrate 102 by epitaxial growth or ion-implantation. A shallow trench isolation (STI) process is performed. Those skilled in the art will recognize various etching techniques such as lithographic masks with directional reactive ion etch (RIE) can be utilized to perform the STI process. The trenches are filled with a first insulating layer 202 comprised of an insulating (dielectric) material such as silicon dioxide (SiO2). The base layer 204 will act as the base in the PNP BJT access devices. The base layer 204 may be comprised of a semiconductor material with negative charge carriers, such as N-doped silicon or N+ silicon. The base layer 204 might incorporate Germanium as well.

Figure 3:
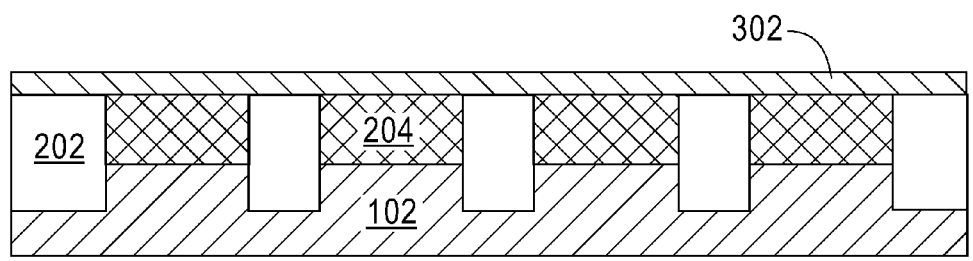
FIG. 3 illustrates gate oxide layer deposition.

Turning to FIG. 3, a CMOS gate oxide layer 302 is deposited above the insulating layer and the base layer. While the CMOS gate oxide layer 302 is deposited on the entire surface of the insulating layer and the base layer the CMOS gate oxide layer 302 will not be a part of the memory cells. The CMOS gate oxide layer 302 will only be a part of the CMOS devices in the integrated circuit.

Figure 4:
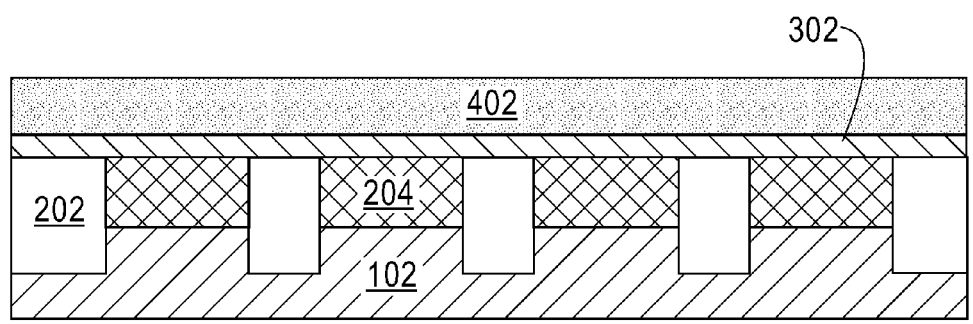
FIG. 4 illustrates polycrystalline silicon layer deposition.

In FIG. 4, a CMOS polycrystalline silicon layer 402 is deposited above the CMOS gate oxide layer 302. Like the CMOS gate oxide layer 302, the CMOS polycrystalline silicon layer 402 illustrated in FIG. 4 will not be a part of the memory cells. In one embodiment of the invention, the CMOS polycrystalline silicon layer 402 is comprised of doped polycrystalline silicon. Those skilled in the art will recognize that the doping of the CMOS polycrystalline silicon layer 402 depends on the type of CMOS being created in the integrated circuit.

Figure 5:
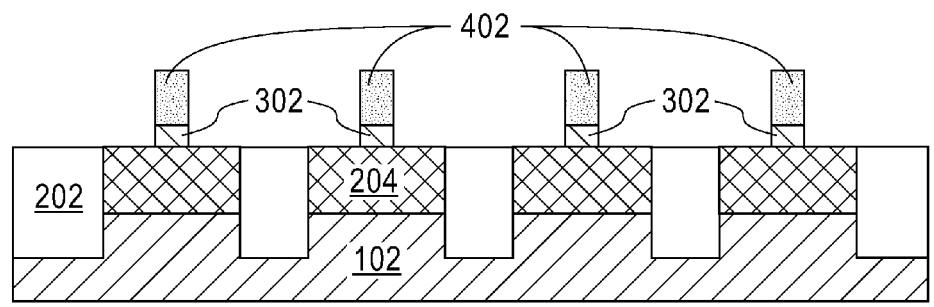
FIG. 5 illustrates a patterned etch.

Now turning to FIG. 5, a patterned etch on the CMOS polycrystalline silicon layer 402 and the CMOS gate oxide layer 302 is carried out. Those skilled in the art will recognize that the patterned etch may be performed with lithographic masks and RIE to etch the CMOS polycrystalline silicon layer 402 and the CMOS gate oxide layer 302. Other techniques known in the art, such as using a hydrogen fluoride (HF) etch, may be used during this patterning step.

Figure 6:
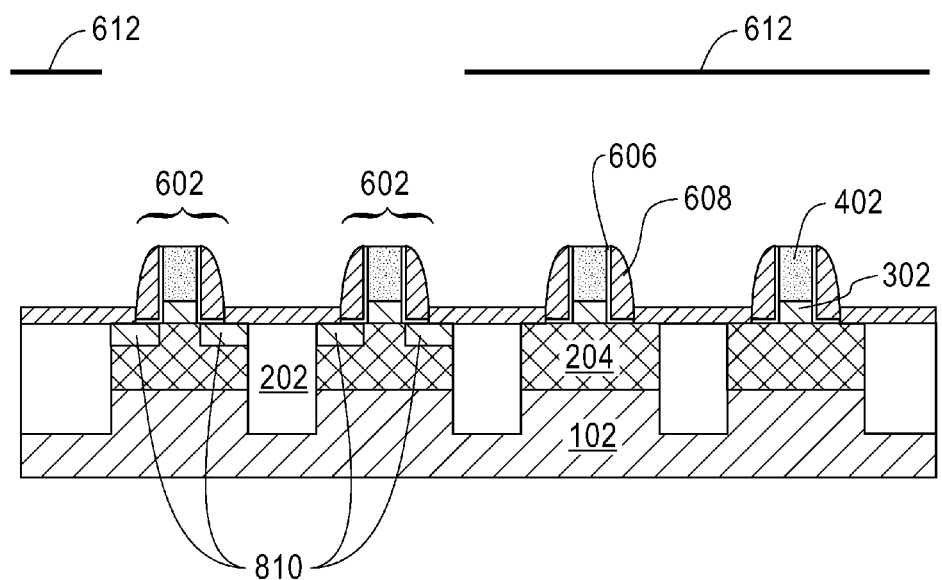
FIG. 6 illustrates spacer formation.

At FIG. 6, nitride spacers 606 are deposited around the pillar structures of the polycrystalline silicon layer 402 and the CMOS gate oxide layer 302. In addition, rapid thermal oxide (RTO) spacers 608 are disposed around the spacers 606. Those skilled in the art will recognize that the formation of the RTO spacers 608 may be performed utilizing thermal oxidation techniques. The formation of the nitride spacers 606 is also well known to those skilled in the art. After the nitride spacers 606 are formed, implants 610 are implanted only on the base layer of the CMOS devices 602 using a mask 612 to tune the characteristics of the peripheral CMOS devices. The implants 610 in the CMOS devices 602 are doped while the base layer 204 for the BJT devices is protected by the mask 612.

Figure 7:
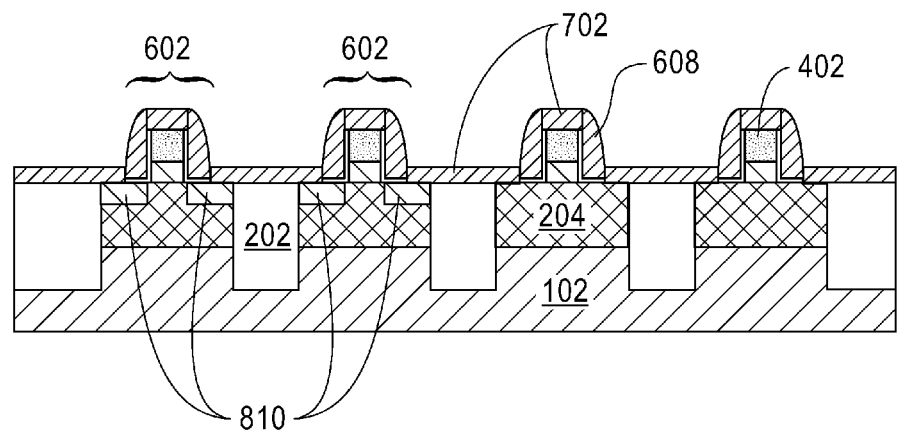
FIG. 7 illustrates protective nitride formation.

In FIG. 7, the mask is removed and a protective nitride layer 702 is deposited above the top surface of the structure. Thus, the nitride layer covers the implants 610, the RTO spacer 608, the insulating layer 202, and the base layer 204. The protective nitride layer 702 protects the CMOS devices 602 from etching performed during the formation of the BJT access devices.

Figure 8:
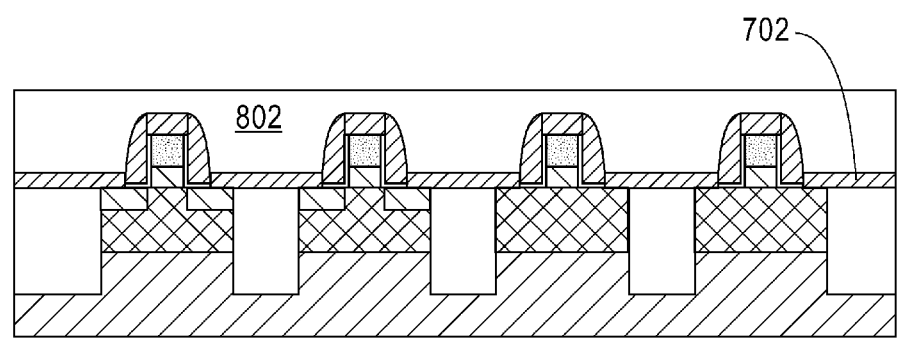
FIG. 8 illustrates sacrificial layer formation.

Turning to FIG. 8, a sacrificial insulating layer 802 is deposited above the protective nitride layer 702. In one embodiment of the invention, the sacrificial insulating layer 802 is comprised of silicon dioxide.

Figure 9:
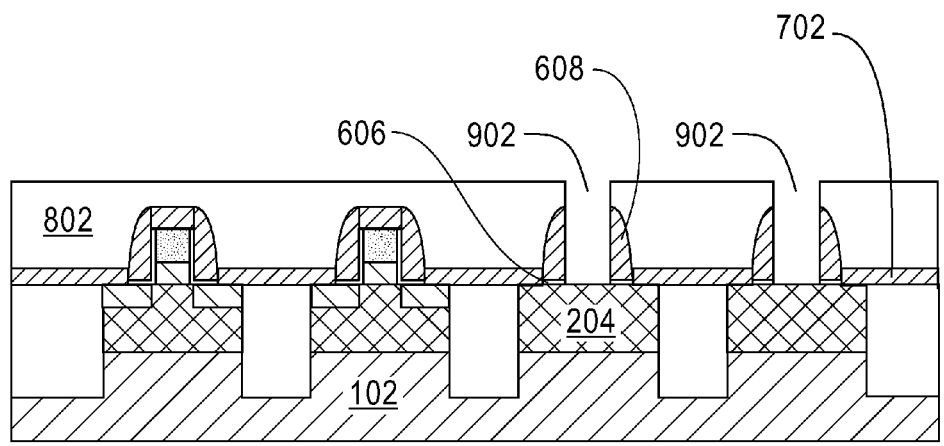
FIG. 9 illustrates trench formation.

In FIG. 9, trenches 902 are formed in the areas of the BJT access devices. As illustrated, the trenches 902 are etched through the sacrificial insulating layer 802, through the protective nitride layer 702, and through the sidewalls of the RTO spacers 608. The trenches 902 stop on the base layer 204. Also illustrated, the nitride spacers 606 and the RTO spacer 608 under the sacrificial insulating layer 802 still remain. The remaining nitride spacers 606 and the RTO spacer 608 are used for the BJT access devices. Those skilled in the art will recognize that a lithographic mask can be formed over the surface of the sacrificial insulating layer 802 and a RIE or wet chemical etching can be performed to etch through the aforementioned layers and structures.

Figure 10:
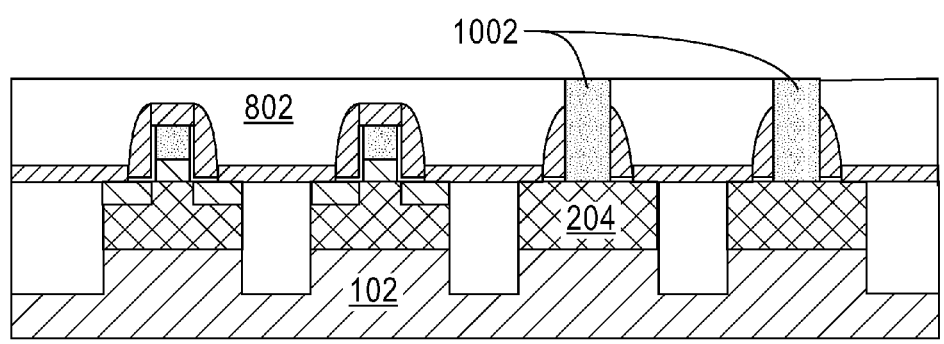
FIG. 10 illustrates emitter layer formation.

In FIG. 10, an emitter layer 1002 is formed within and completely filling the trenches 902 (see FIG. 9) and above the base layer 204. The emitter layer 1002 serves as the emitter in the PNP BJT access device. The emitter layer 1002 may be comprised of a variety of semiconductor materials with positive charge ("holes"). An example of this would be P-doped polycrystalline silicon or P+ polycrystalline silicon. This layer could be formed by, for example, low pressure chemical vapor deposition (LPCVD), rapid thermal chemical vapor deposition (RTCVD), or atomic layer chemical vapor deposition (ALCVD). This region could be doped by, for example, ion implantation or by diffusion during the deposition process. In one embodiment of the invention, a very thin insulator layer comprising of SiO2 may be present between the interface of the emitter layer 1002 and the base layer 204. The purpose of this very thin insulator layer, if used, is to ensure that the emitter layer 1002 will not turn into single-crystalline form, but will remain in polycrystalline form, during the subsequent fabrication steps. A BJT having a polycrystalline emitter has smaller base current than a BJT having a single-crystalline emitter. Thus, a small base current reduces crosstalk among memory cells.

In one embodiment of the present invention, after the emitter layer 1002 has been deposited into the trenches, a chemical-mechanical polish (CMP) is performed so the surface of the sacrificial insulating layer 802 and the surface of the emitter layer 1002 are level and parallel to the surface of the substrate 202.

Figure 11:
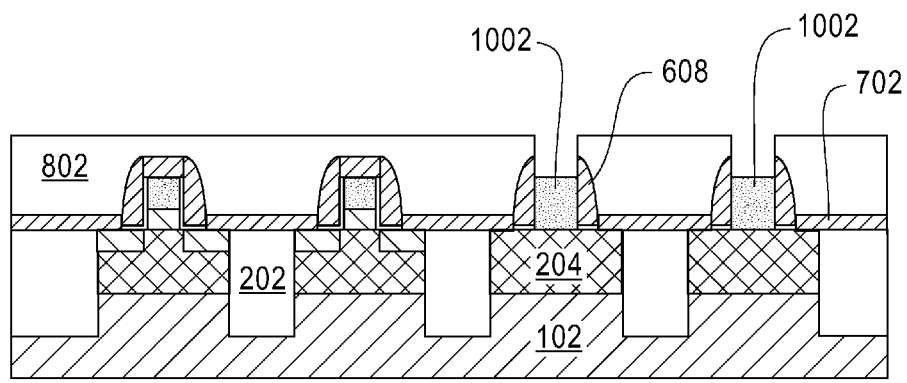
FIG. 11 illustrates recessing of the emitter layer.

Referring to FIG. 11, the emitter layer 1002 is recessed. The emitter layer 1002 is recessed so that the emitter layer 1002 may be contained within the RTO spacers 608. In one embodiment of the invention, a timed RIE is employed since there is no etch stop preventing the complete etching of the emitter layer 1002.

Figure 12:
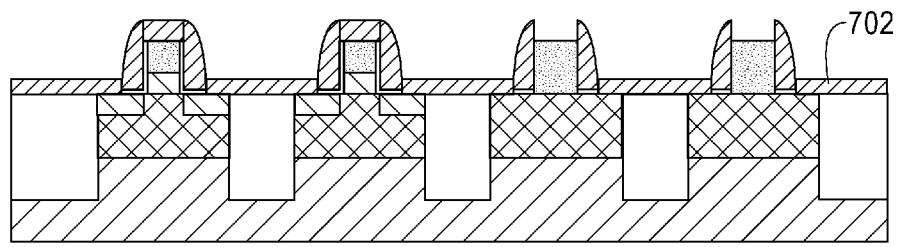
FIG. 12 illustrates sacrificial layer removal.

Turning to FIG. 12, the sacrificial insulating layer 802 (see FIG. 11) is removed. An etch stopping on the nitride spacer and the emitter layer is employed. Wet etches such as dilute hydrofluoric acid (DHF) may be utilized for this step of the process.

Figure 13:
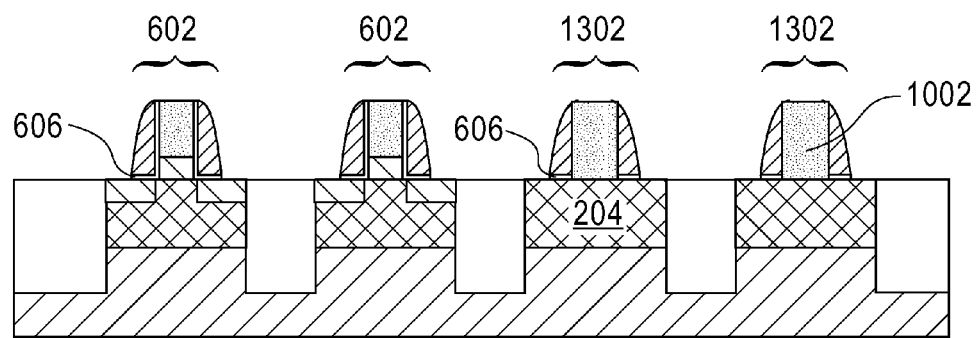
FIG. 13 illustrates protective nitride removal.

In FIG. 13, the protective nitride layer 702 (see FIG. 12) is removed, leaving the nitride spacer 606, the CMOS devices 602, and PNP BJT device 1302 exposed. Those skilled in the art may recognize that the removal of the protective nitride layer can be performed by a timed RIE that does not remove the emitter layer 1002 or base layer 204 (polycrystalline silicon). Alternatively, a timed RIE with a lithographic mask over the emitter layer 1002 and polycrystalline silicon may be used during this step.

Figure 14:
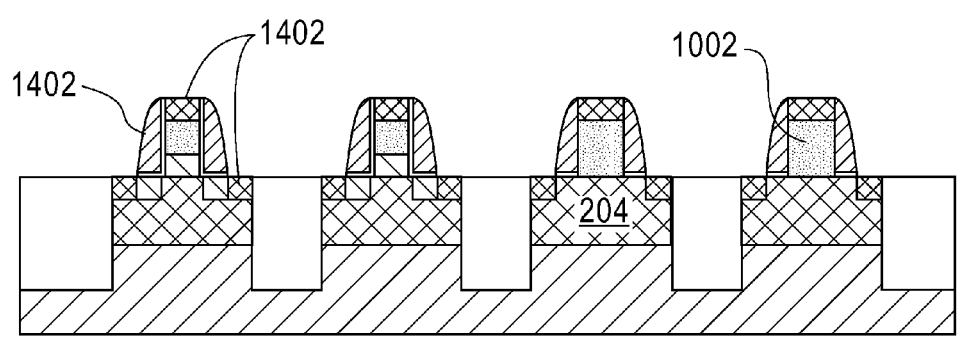
FIG. 14 illustrates silicidation.

FIG. 14 illustrates silicidation of the exposed base layer 204 and the emitter layer 1002. Those skilled in the art will recognize that a variety of metals, such as nickel (Ni), tungsten (W), or cobalt (Co), may be employed for silicidation. The metal is deposited above the emitter layer 1002 and above the exposed base layer 204. A rapid thermal anneal (RTA) is performed to form the bonds between the silicon and metal, and a wet metal etch is performed to remove any un-reacted metal.

Figure 15A:
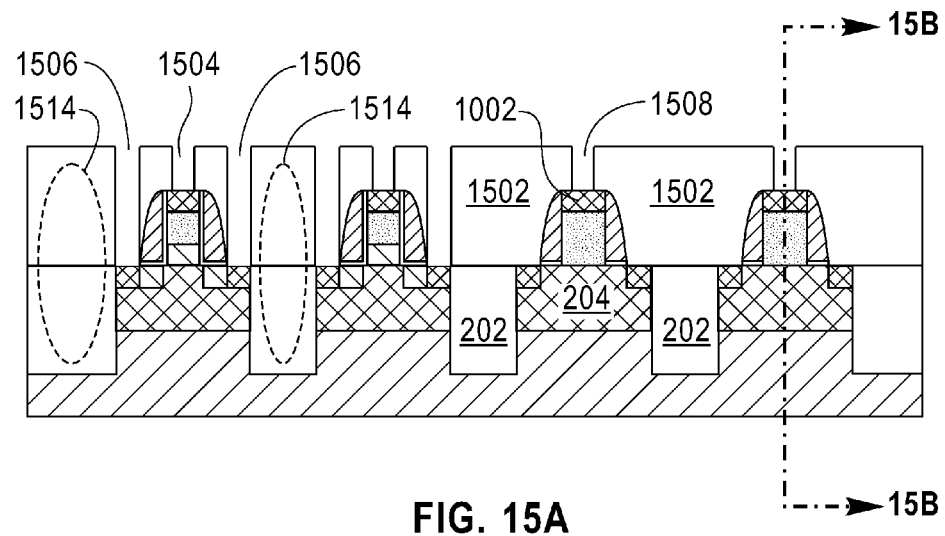
FIGS. 15A and B illustrate an insulating layer deposition and trench formation.
Figure 15B:
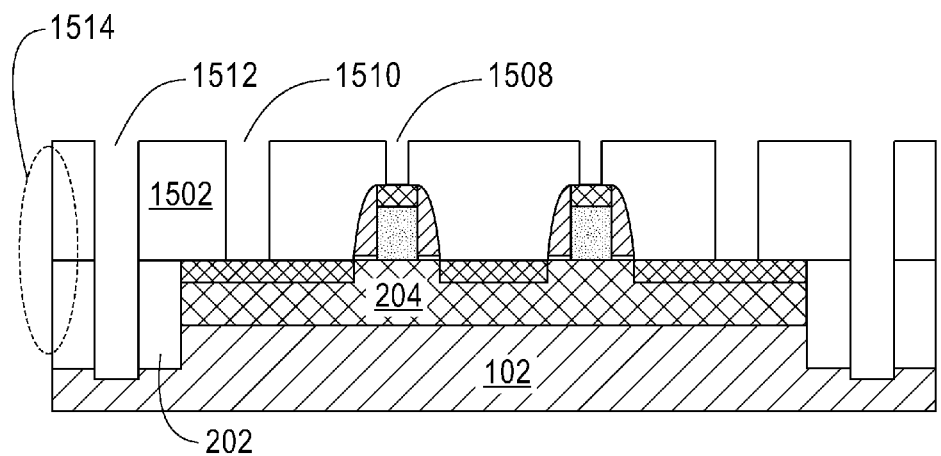

Now turning to FIGS. 15A and 15B, a second insulating layer 1502 is deposited over the CMOS and PNP BJT devices. FIG. 15B is a cross sectional view of FIG. 15A along line 15B-15B. The first insulating layer 204 and the second insulating layer 1502 create an insulating region 1514 containing the base layer 204 and the emitter layer 1002. In addition, several trenches are formed in the insulating layer 1502. Those skilled in the art will recognize the trenches may be formed utilizing normal RIE processes, as described above.

Referring to FIG. 15A, a set of CMOS polycrystalline silicon trenches 1504, a set of CMOS base layer trenches 1506, and a set of emitter layer trenches 1508 are formed. The trenches are formed such that the bottoms of the trenches are the surfaces of the silicide formed over the structures.

Referring to FIG. 15B, a set of base layer trenches 1510 are formed through the second insulating layer 1502 so that the bottom of the trenches are the surface of the silicide formed in base layer 204. A set of collector contact trenches 1512 are formed through the insulating region 1514 (the second insulating layer 1502 and the first insulating layer 202), and into the substrate.

Figure 16A:
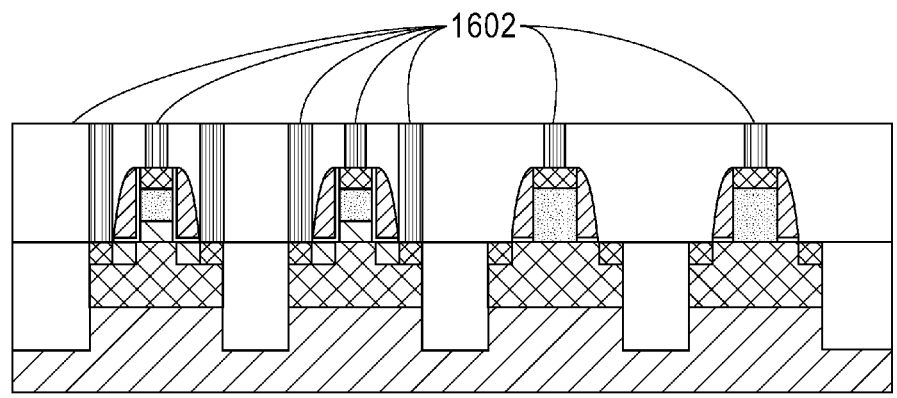
FIGS. 16A and B illustrate liner and plug formation.
Figure 16B:
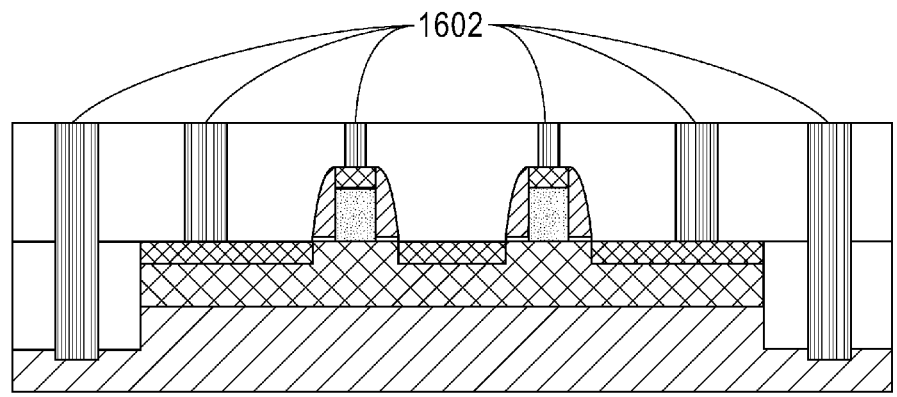

FIG. 16A shows a deposition of a liner and tungsten (W) plug 1602 filling the set of CMOS polycrystalline silicon trenches 1504, the set of CMOS base layer trenches 1506, and a set of emitter layer trenches 1508 (see FIG. 15A). FIG. 16B illustrates a deposition of a liner and tungsten (W) plug 1602 filling the set of base layer trenches 1510 and the set of collector contact trenches 1512 (see FIG. 15B). In one embodiment of the invention, the tungsten plug 1602 in the CMOS polycrystalline silicon trenches is coupled to memory decoding and selection logic (not shown). The tungsten plug 1602 in the CMOS base layer trenches is coupled to ground. The tungsten plug 1602 in the set of emitter layer trenches is utilized to form a bit-line for the memory cells.

Figure 17A:
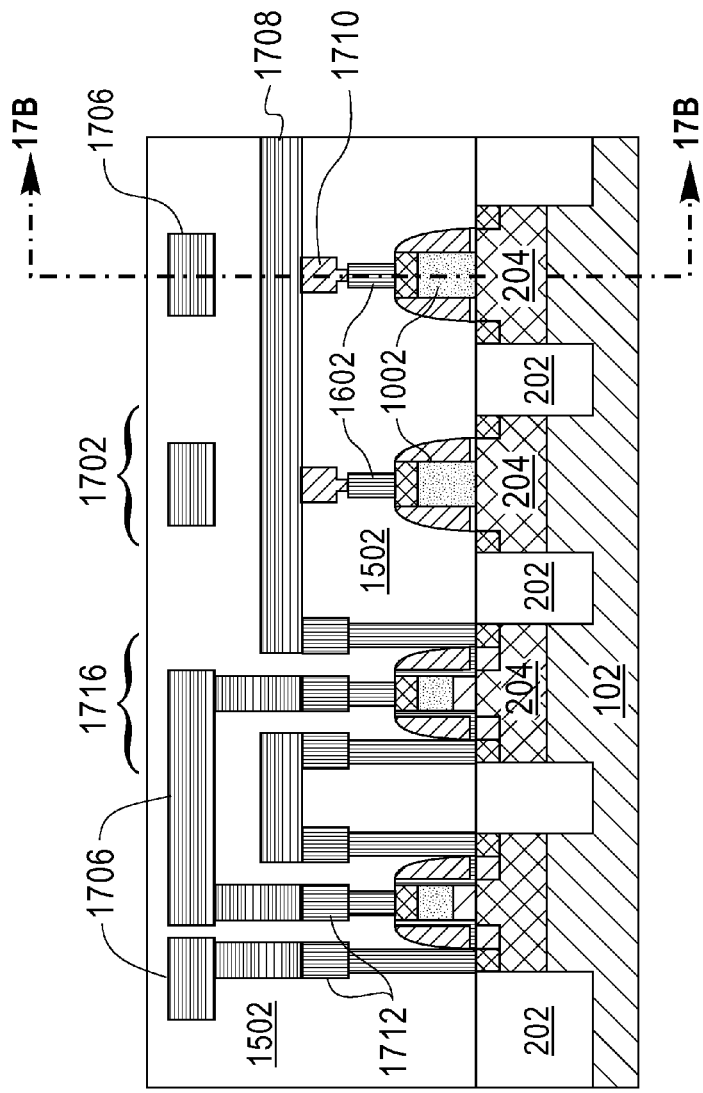
FIGS. 17A and B illustrate integration of the memory elements and metallization.
Figure 17B:
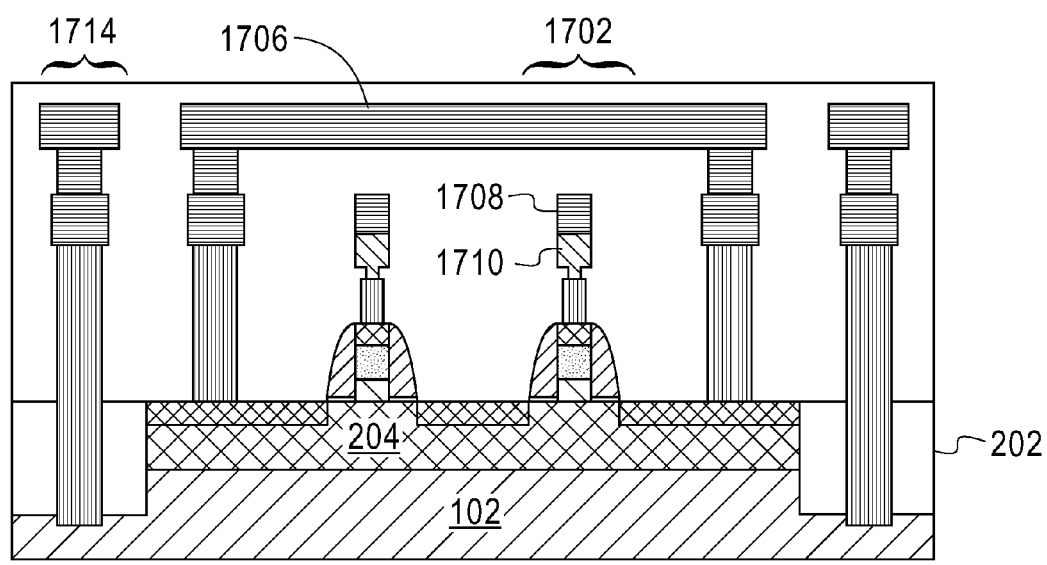

FIGS. 17A and 17B illustrate integration of the memory element 1710 and metallization. In one embodiment, the memory element 1710 is comprised of phase change elements. FIG. 17B is a cross sectional view of FIG. 17A along line 17B-17B. Memory cells 1702 and the CMOS device 1716 are connected with metal lines. The phase change element 1710 is formed above the tungsten plug 1602 in the memory cells 1702. The phase change element 1710 may be formed from a chalcogenide. In one embodiment of the invention, the chalcogenide utilized is, but not limited to, a germanium-antimony-tellurium (GST) chalcogenide glass (Ge2Sb2Te5). Those skilled in the art will recognize methods for phase change element 1710 formation.

For the memory cells 1702, bit-lines 1708 and word-lines 1706 are formed from a conductive metal such as copper (Cu). As illustrated, the bit-lines 1708 in FIG. 17A and the word-lines 1706 in FIG. 17B are perpendicular to each other. Those skilled in the art will recognize the methods required for bit-line 1708 and word-line 1706 formation.

Also formed during integration and metallization are CMOS to CMOS connections 1704 made of a conductive metal such as copper (Cu), tungsten (W) connectors 1712 for the CMOS devices 1716, and collector contacts 1714. Those skilled in the art will recognize the processes necessary to form phase change elements 1710, the integration of memory cells 1702, and metallization.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Having thus described the invention of the present application in detail and by reference to embodiments thereof, it will be apparent that modifications and variations are possible without departing from the scope of the invention defined in the appended claims.

That which is claimed is:

1. A memory array comprising one or more memory cells, at least one of the memory cells comprising:
   a substrate comprised of silicon;
   an insulating region comprising insulating material above the substrate;
   a base layer comprised of silicon above the substrate and contained within the insulating region, the base layer forming a word-line;
   an emitter layer comprised of a semiconductor material above the base layer and contained within the insulating region, the semiconductor material being substantially polycrystalline silicon;
   a plug comprised of conductive material above the emitter layer and contained within the insulating region;
   a phase change element comprised of phase change material above the plug and contained within the insulating region; and
   a top electrode layer comprised of conductive material above the phase change element and contained within the insulating region, the top electrode forming a bit-line.

2. The memory array of claim 1, further comprising a silicide layer comprised of silicide above the emitter layer, the silicide layer disposed below the plug and contained within the insulating region.

3. The memory array of claim 1, wherein the emitter layer is contained within a spacer, the spacer contained within the insulating region.

4. The memory array of claim 1, wherein the substrate is comprised of P-doped silicon.

5. The memory array of claim 1, wherein the base layer is comprised of N-doped silicon.

6. The memory array of claim 1, wherein the emitter layer is comprised of P-doped polycrystalline silicon.

7. The memory array of claim 1, wherein the plug is comprised of tungsten.

8. The memory array of claim 1, wherein the top electrode is comprised of a conductive metal.

9. The memory array of claim 1, wherein the base layer is comprised of SiGe.

10. The memory array of claim 1, wherein the base layer is substantially single-crystalline silicon.

11. The memory array of claim 1, wherein the substrate forms a collector of a bipolar junction transistor (BJT), the BJT including the base layer forming a base of the BJT and the emitter layer forming an emitter of the BJT.

12. The memory array of claim 1, wherein the emitter layer is positioned between the plug and the base layer.

13. The memory array of claim 1, wherein the silicon of the base layer is below at least a part of the insulating region and at the top of the substrate.

\* \* \* \* \*